(12) United States Patent
Kim et al.

(10) Patent No.: US 7,999,271 B2
(45) Date of Patent: Aug. 16, 2011

(54) LUMINOUS ELEMENT HAVING A PLURALITY OF CELLS

(75) Inventors: Dae Won Kim, Ansan-si (KR); Dae Sung Kal, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 189 days.

(21) Appl. No.: 12/514,770

(22) PCT Filed: Dec. 7, 2007

(86) PCT No.: PCT/KR2007/006342
§ 371 (c)(1),
(2), (4) Date: May 13, 2009

(87) PCT Pub. No.: WO2008/078880
PCT Pub. Date: Jul. 3, 2008

(65) Prior Publication Data
US 2010/0059763 A1    Mar. 11, 2010

(30) Foreign Application Priority Data

Dec. 22, 2006   (KR) .................. 10-2006-0132784

(51) Int. Cl.
*H01L 33/00* (2010.01)
(52) U.S. Cl. ................................. 257/88; 257/E33.055

(58) Field of Classification Search .................... 257/77, 257/88, E33.025, E33.015, E33.066, E33.062, 257/79, 99, E33.055
See application file for complete search history.

(56) References Cited

U.S. PATENT DOCUMENTS

2004/0075399 A1*  4/2004  Hall ............................ 315/291

FOREIGN PATENT DOCUMENTS

| JP | 2002-016290 | | 1/2002 |
| JP | 2004-006582 | | 1/2004 |
| KR | 10-2004-0009818 | | 1/2004 |
| KR | 10-2006-0020572 | | 3/2006 |
| WO | WO2006/004337 | * | 1/2006 |

* cited by examiner

*Primary Examiner* — Thomas L Dickey
*Assistant Examiner* — Nikolay Yushin
(74) *Attorney, Agent, or Firm* — H.C. Park & Associates, PLC

(57) ABSTRACT

Disclosed is a light emitting element comprising a first array having a plurality of vertical light emitting cells connected in series on a single substrate; and a second array that has another plurality of vertical light emitting cells connected in series on the single substrate and is connected to the first array in reverse parallel. In the light emitting element, each of the vertical light emitting cells in the first and second arrays has a first electrode pad on a bottom surface thereof and a second electrode pad on a top surface thereof, and a connection portion is provided to electrically connect the first electrode pad of the vertical light emitting cell in the first array to the first electrode pad of the vertical light emitting cell in the second array.

12 Claims, 2 Drawing Sheets

LUMINOUS ELEMENT HAVING A PLURALITY OF CELLS

CROSS-REFERENCE TO RELATED APPLICATIONS

This application is the National Stage of International Application No. PCT/KR2007/006342, filed Dec. 7, 2007, and claims priority from and the benefit of Korean Patent Application No. 10-2006-0132784, filed on Dec. 22, 2006, which are both hereby incorporated by reference for all purposes as if fully set forth herein.

BACKGROUND OF THE INVENTION

1. Field of the Invention

The present invention relates to a light emitting element having a plurality of cells, and more particularly, to a light emitting element having a plurality of vertical light emitting cells arranged on a single substrate.

2. Discussion of the Background

A light emitting diode (LED) is an element in which minority carriers (electrons or holes) injected using a P-N junction structure of a semiconductor are produced and certain light is emitted through recombination of the carriers. Such an LED is used as a display element or a backlight. Recently, studies have been actively conducted to apply the LED to general illumination.

As such, an LED applied to general illumination consumes less electrical power and has a longer lifespan as compared with conventional light bulbs or fluorescent lamps. That is, since the LED consumes several to several tens of times less power and has several to several tens of times longer lifespan than the conventional illumination devices, it is further superior in view of power saving and durability.

Generally, in order to use an LED for the purpose of illumination, the LED is manufactured in the form of a lamp by forming light emitting elements through an additional packaging process, connecting a plurality of the light emitting elements in series through wire bonding, and installing a protection circuit, an alternating current/direct current (AC/DC) converter and the like at the outside of the light emitting elements.

FIG. 1 is a conceptual diagram showing a conventional light emitting apparatus.

Referring to FIG. 1, a light emitting apparatus for general illumination is manufactured by serially connecting a plurality of light emitting elements 1 on which light emitting chips are respectively mounted. To this end, the plurality of light emitting elements 1 are arrayed in series, and the light emitting chips within different light emitting elements 1 are then electrically connected in series through a metal wiring process. Such a manufacturing process is disclosed in U.S. Pat. No. 5,463,280. However, if a light emitting apparatus for general illumination is manufactured based on the conventional technique, there is a problem in that the metal wiring process is performed on a large number of light emitting elements 1 one by one so that processing steps are increased in number and complicated. As the number of the processing steps is increased, a percent defective also increases, thereby inhibiting mass production. Further, there may be a case where the metal wiring is short circuited due to a certain shock and the operations of light emitting elements 1 are stopped. Furthermore, if the respective light emitting elements 1 are connected in series, there is a disadvantage in that spaces occupied by the light emitting elements 1 are expanded, so that a lamp becomes considerably voluminous.

A wafer level array of microchips rather than the element level array of light emitting chips described above is disclosed in Korean Patent Laid-Open Publication No. 2004-9818. This relates to a display apparatus, wherein light emitting cells are arranged in a matrix form such that LEDs for inducing luminescence are disposed at respective pixels. However, since different electrical signals should be applied in respective vertical and horizontal directions and also in an address manner to allow the elements arranged in the matrix form to emit light, they are extremely difficult to control. Further, wiring may be disconnected due to the array in a matrix form, and a great deal of interference occurs in an area where wires overlap with one another. Furthermore, there is a problem in that the aforementioned structure in a matrix form is not applicable to a light emitting apparatus for illumination to which a high voltage is applied.

SUMMARY OF THE INVENTION

The present invention is conceived to solve the aforementioned problems. Accordingly, an object of the present invention is to provide a light emitting element, wherein a plurality of vertical light emitting cells arranged on a single substrate can be driven by an AC current.

Another object of the present invention is to provide a light emitting element having a plurality of arrayed cells, wherein since the plurality of light emitting cells are electrically connected at a wafer level, the process of manufacturing a package can be simplified and a percentage of defective can be reduced, thereby facilitating mass production of the light emitting element.

According to an aspect of the present invention, there is provided a light emitting element comprising at least one first array having a plurality of vertical light emitting cells connected in series on a single substrate; and at least one second array that has another plurality of vertical light emitting cells connected in series on the single substrate and is connected to the first array in reverse parallel. Each of the vertical light emitting cells in the first and second arrays has a first electrode pad on a bottom surface thereof and a second electrode pad on a top surface thereof, and a connection portion is provided to electrically connect respective first electrode pads of the vertical light emitting cells in the first array to first electrode pads of the vertical light emitting cells in the second array.

The number of vertical light emitting cells in the first array may be identical with that of vertical light emitting cells in the second array.

Preferably, the connection portion may be formed of the same material as the first electrode pad. More preferably, the connection portion and the first electrode pad may be formed simultaneously.

The first electrode pads of the first and second arrays connected to each other through the connection portion may be positioned close to each other.

As described above, according to the present invention, it is possible to manufacture a light emitting apparatus that can be used for illumination, using a light emitting element that includes a light emitting cell block with a plurality of vertical light emitting cells connected in series.

Further, since a plurality of light emitting cells are electrically connected at a wafer level, it is possible to manufacture a light emitting element capable of emitting light with high power or household AC power.

Furthermore, since a light emitting element having a plurality of light emitting cells electrically connected on a substrate is used, the process of manufacturing a light emitting apparatus for illumination can be simplified, a percentage of defective occurring upon manufacture of the light emitting apparatus can be reduced, and thus, the light emitting apparatus can be mass-produced.

DETAILED DESCRIPTION OF THE ILLUSTRATED EMBODIMENTS

Figure 1:
FIG. 1 is a conceptual diagram showing a conventional light emitting apparatus.
Figure 1:

Hereinafter, preferred embodiments of the present invention will be described in detail with reference to the accompanying drawings. However, the present invention is not limited to the embodiments but may be implemented into different forms. These embodiments are provided only for illustrative purposes and for full understanding of the scope of the present invention by those skilled in the art. Throughout the drawings, like elements are designated by like reference numerals.

Figure 2:
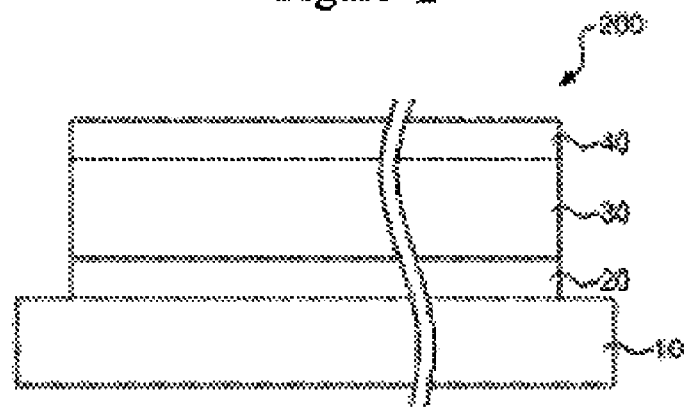
FIG. 2 is a sectional view showing a light emitting element according to an embodiment of the present invention.
Figure 3:
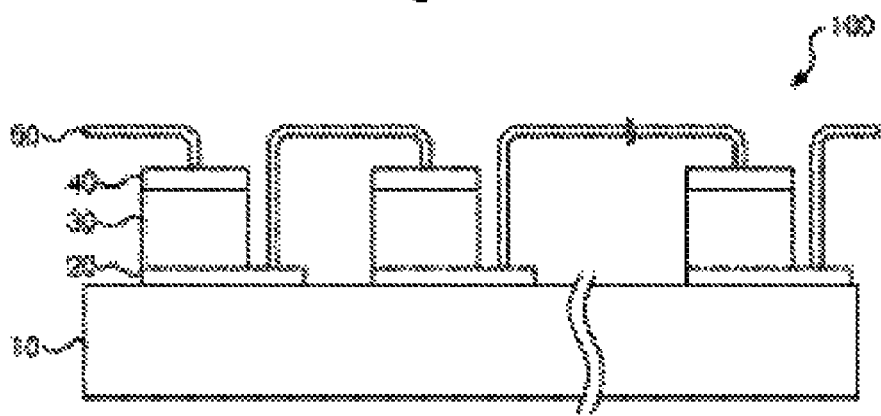
FIG. 3 is a sectional view showing a portion of a light emitting element according to an embodiment of the present invention.
Figure 4:
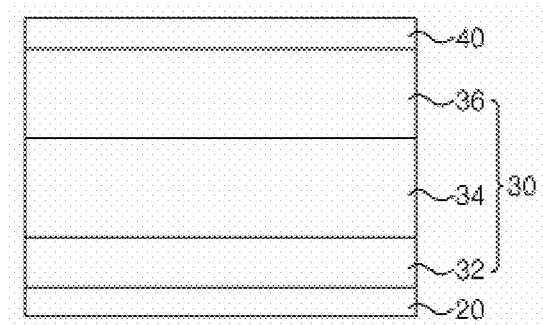
FIG. 4 is a sectional view showing a light emitting cell according to an embodiment of the present invention.

FIG. 2 is a sectional view showing a light emitting element according to an embodiment of the present invention, FIG. 3 is a sectional view showing a portion of a light emitting element according to an embodiment of the present invention, and FIG. 4 is a sectional view showing a light emitting cell 100 according to an embodiment of the present invention.

Referring to FIG. 2, a vertical light emitting laminate 200 comprising a light emitting semiconductor layer 30 and first and second electrode pads 20 and 40 respectively formed on bottom and top surfaces of the light emitting semiconductor layer 30 is disposed on a substrate 10.

In this embodiment, a silicon substrate is used as the substrate 10. It will be apparent that the present invention is not limited thereto. That is, an insulative substrate, a substrate with a semiconductor property other than the silicon substrate, or a substrate with excellent thermal conductivity may be used as the substrate 10. If the conductive substrate is used, an insulating layer for providing insulation is formed on the top surface of the conductive substrate.

As shown in FIG. 4, the vertical light emitting laminate 200 comprises a light emitting semiconductor layer 30 having a base substrate 32, a first lower conductive semiconductor layer 34 and a second upper conductive semiconductor layer 36; and first and second electrode pads 20 and 40 (N-type and P-type electrode pads or P-type and N-type electrode pads) respectively formed on bottom and top surfaces of the light emitting semiconductor layer 30. To this end, the first and second conductive semiconductor layers 34 and 36 are sequentially formed on the base substrate 32, and the first electrode pad 20 is formed on the bottom surface of the base substrate 32, and the second electrode pad 40 is formed on the top surface of the second conductive semiconductor layer 36.

The light emitting semiconductor layer 30 is not limited to the foregoing but may further comprise a buffer layer (not shown) and/or an active layer (not shown). In this case, such a buffer layer or active layer may be considered as a layer included in the first or second conductive semiconductor layer 34 or 36.

Thereafter, the light emitting laminate 200 is bonded to the substrate 10 using a certain paste (not shown). It will be apparent that the light emitting laminate 200 and the substrate 10 may be bonded together by means of various bonding methods other than the method using a certain paste.

Thereafter, the second electrode pad 40, the light emitting semiconductor layer 30 and the first electrode pad 20 of the vertical light emitting laminate 200 are partially etched through a predetermined etching process, thereby forming light emitting cells 100 having a structure shown in FIG. 3 on the substrate 10. Here, the light emitting cells 100 in the same array, i.e., in a first array 1000 or a second array 2000 (see FIG. 5) that will be described later, are etched down to the first electrode pad 20 so as to be electrically separated from one another. Light emitting cells 100 adjacent between different arrays (i.e., between the first and second arrays 1000 and 2000) are electrically connected through a connection portion 60 (see FIGS. 5 and 6) formed to extend from the first electrode pad 20. At this time, the connection portion 60 may be a portion that is not removed in the etching process to electrically connect adjacent arrays.

Subsequently, a portion of the first electrode pad 20 formed at a lower portion of each light emitting cell 100 in the same array is exposed, and electrodes of the light emitting cells 100 in the same array are connected through a predetermined wiring process. That is, in the same array, the exposed portion of the first electrode pad 20 of one light emitting cell 100 is connected to the second electrode pad 40 of another adjacent light emitting cell 100 through a wire 50. Accordingly, the light emitting cells 100 in the same array may be connected in series. At this time, the conductive wires 50 for electrically connecting the first and second electrode pads 20 and 40 of adjacent light emitting cells 100 are formed through a process such as an air-bridge process or a step-cover process.

Figure 5:
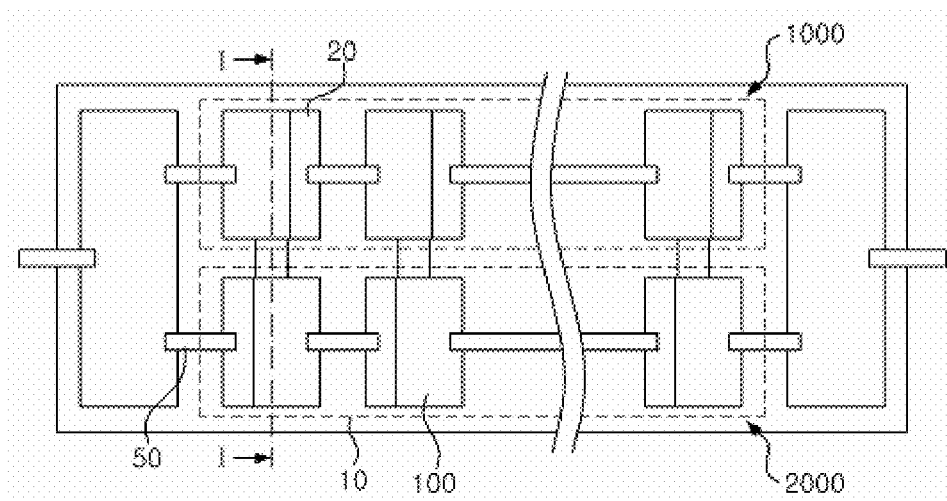
FIG. 5 is a plan view showing a light emitting element according to an embodiment of the present invention.
Figure 6:
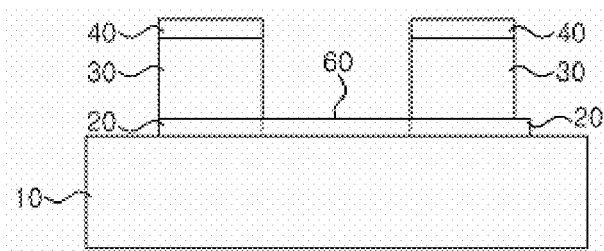
FIG. 6 is a sectional view taken along line I-I in FIG. 5.

FIG. 5 is a plan view showing a light emitting element according to an embodiment of the present invention, and FIG. 6 is a sectional view taken along line I-I in FIG. 5.

Referring to FIGS. 5 and 6, first and second arrays 1000 and 2000 each of which has a plurality of vertical light emitting cells 100 connected in series are formed on a single substrate 10, and the first and second arrays 1000 and 2000 are connected in reverse parallel using electrode pads 70 formed at both ends. A first electrode pad 20 disposed at a lower portion of one light emitting cell 100 of the first array 1000 is connected to an adjacent first electrode pad 20 disposed at a lower portion of one light emitting cell 100 of the second array 2000 through a connection portion 60.

The connection portion 60 may be a portion that is not etched when the first electrode pad 20 of the light emitting laminate 200 of FIG. 2 is etched. Thus, the connection portion 60 and the first electrode pad 20 may be simultaneously made of the same material.

In the embodiment of the present invention, light emitting cells 100 are formed by forming first and second electrode pads 20 and 40 respectively on bottom and top surfaces of a light emitting laminate 200 in which an n-GaN first conductive semiconductor layer 34 and a p-GaN second conductive semiconductor layer 36 are sequentially laminated on a SiC base substrate 32, bonding the light emitting laminate 200 to a substrate 10 (e.g., a silicon substrate), and then performing a predetermined etching process. However, the present invention is not limited to such a method. For example, the vertical light emitting element of the present invention may be formed by forming a laminate having the n-GaN first conductive semiconductor layer 34, the p-GaN second conductive semiconductor layer 36 and a second electrode pad 40 on a mother substrate, etching the laminate, bonding a submount substrate to a surface of a light emitting layer opposing to the mother substrate, separating the mother substrate from the laminate, and then bonding a base substrate 32 with a first electrode pad 20 formed thereon to the submount substrate.

Preferably, the number of vertical light emitting cells 100 constituting the light emitting element of the present invention corresponds to the value of an AC voltage for driving the vertical light emitting cells 100. That is, in the present invention, the number of light emitting cells 100 connected in series may quite vary depending on a voltage/current for driving a single light emitting cell 100 and an AC driving voltage applied to a light emitting element for illumination. Preferably, 10 to 1000 light emitting cells 100 are connected in series. More preferably, 30 to 70 light emitting cells 100 are connected in series. For example, a light emitting element is fabricated by connecting 66 or 67 unit LED cells 100 for 3.3V in series at a certain driving current in connection with household 220V AC power. Alternatively, a light emitting element is fabricated by connecting 33 or 34 unit LED cells 100 for 3.3V in series at a certain driving current in connection with household 110V AC power. More preferably, the numbers of vertical light emitting cells 100 in the first and second arrays 1000 and 2000 are identical with each other in the present invention.

The invention claimed is:

1. A light emitting element, comprising:
   at least one first array comprising a plurality of vertical light emitting cells connected in series on a single substrate; and
   at least one second array comprising another plurality of vertical light emitting cells connected in series on the single substrate, the second array being connected to the first array in reverse parallel,
   wherein each of the vertical light emitting cells in the first array and second array comprises a first electrode pad disposed on a bottom surface thereof and a second electrode pad disposed on a top surface thereof, and
   a connection portion to electrically connect the first electrode pad of each vertical light emitting cell in the first array to the first electrode pad of the respective vertical light emitting cell in the second array.

2. The light emitting element of claim 1, wherein a number of vertical light emitting cells in the first array equals the number of vertical light emitting cells in the second array.

3. The light emitting element of claim 1, wherein the connection portion comprises the same material as the first electrode pad.

4. The light emitting element of claim 3, wherein the connection portion and the first electrode pad are formed of the same layer simultaneously.

5. The light emitting element of claim 1, wherein respective first electrode pads of the first array and first electrode pads of the second array connected to each other through the connection portion are disposed on immediately adjacent cells.

6. The light emitting element of claim 1, wherein each of the plurality of vertical light emitting cells in the first array and the second array further comprises a light emitting semiconductor layer disposed between the first electrode pad and the second electrode pad, wherein the light emitting semiconductor layer comprises a laminate comprising a base substrate, a first conductive semiconductor layer disposed thereon, and a second conductive semiconductor layer disposed on the first conductive semiconductor layer.

7. The light emitting element of claim 6, wherein the base substrate comprises SiC, the first conductive semiconductor layer comprises an n-GaN semiconductor, and the second conductive semiconductor layer comprises a p-GaN semiconductor.

8. The light emitting element of claim 1, further comprising conductive wires, each wire electrically connecting the first electrode pad of one vertical light emitting cell and the second electrode pad of another light emitting cell adjacent to the one vertical light emitting cell.

9. The light emitting element of claim 1, wherein 10 to 1000 vertical light emitting cells are connected in series in the first array and the second array.

10. The light emitting element of claim 9, wherein 30 to 70 vertical light emitting cells are connected in series.

11. The light emitting element of claim 1, wherein the first electrode pads are N-type electrode pads and the second electrode pads are P-type electrode pads or the first electrode pads are P-type electrode pads and the second electrode pads are N-type electrode pads.

12. The light emitting element of claim 1, wherein the connection portion connects the first electrode pad of a first vertical light emitting cell in the first array to the first electrode pad of a second vertical light emitting cell in the second array, and wherein the connection portion, the first electrode pad of the first vertical light emitting cell, and the first electrode pad of the second vertical light emitting cell are integrally formed.

* * * * *